United States Patent
Jung et al.

(10) Patent No.: US 9,349,683 B2
(45) Date of Patent: May 24, 2016

(54) CHIP-ON-FILM PACKAGE HAVING BENDING PART

(71) Applicant: Samsung Electronics Co., Ltd., Suwon-si, Gyeonggi-do (KR)

(72) Inventors: Jae-Min Jung, Seoul (KR); Jeong-Kyu Ha, Hwaseong-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/714,234

(22) Filed: May 15, 2015

(65) Prior Publication Data

US 2016/0049356 A1 Feb. 18, 2016

(30) Foreign Application Priority Data

Aug. 13, 2014 (KR) .......................... 10-2014-0105205

(51) Int. Cl.
| | | |
|---|---|---|
| H01L 23/00 | (2006.01) | |
| H01L 23/498 | (2006.01) | |
| H01L 25/065 | (2006.01) | |
| H01L 23/48 | (2006.01) | |

(52) U.S. Cl.
CPC .......... *H01L 23/4985* (2013.01); *H01L 23/481* (2013.01); *H01L 23/49827* (2013.01); *H01L 23/49838* (2013.01); *H01L 24/29* (2013.01); *H01L 24/32* (2013.01); *H01L 24/48* (2013.01); *H01L 24/49* (2013.01); *H01L 24/83* (2013.01); *H01L 25/0655* (2013.01)

(58) Field of Classification Search
CPC ......... H01L 24/48; H01L 24/83; H01L 24/29; H01L 24/45; H01L 24/32; H01L 23/4985; H01L 24/49; H01L 23/481
See application file for complete search history.

(56) References Cited

U.S. PATENT DOCUMENTS

| | | | |
|---|---|---|---|
| 6,121,988 A | 9/2000 | Uchiyama | |
| 6,208,521 B1 | 3/2001 | Nakatsuka | |
| 6,441,474 B2 | 8/2002 | Naitoh et al. | |
| 7,435,914 B2 | 10/2008 | Cheng | |
| 2011/0291302 A1* | 12/2011 | Mueller | H01L 24/29 257/783 |
| 2013/0293816 A1 | 11/2013 | Jung et al. | |
| 2014/0300849 A1* | 10/2014 | Jung | H01L 27/3276 349/139 |
| 2014/0307396 A1* | 10/2014 | Lee | H05K 1/028 361/749 |
| 2014/0327148 A1* | 11/2014 | Lim | H01L 23/00 257/774 |
| 2015/0060931 A1* | 3/2015 | Jung | H01L 27/15 257/99 |

* cited by examiner

*Primary Examiner* — Ngan Ngo
(74) *Attorney, Agent, or Firm* — Renaissance IP Law Group LLP

(57) ABSTRACT

A chip-on-film package comprises a film substrate comprising upper and lower surfaces, and a side having a bending part. A first output interconnection formed on the upper surface of the film substrate extends from a semiconductor chip disposed on the upper surface toward the bending part. A second output interconnection includes an upper output interconnection formed on the upper surface of the film substrate, and a lower output interconnection formed on the lower surface and extending onto the bending part. An input interconnection includes an upper input interconnection formed on the upper surface of the film substrate and a lower input interconnection formed on the lower surface and extending away from the bending part. Through-vias are formed to pass through the film substrate and electrically connect the upper output interconnection to the lower output interconnection, and the upper input interconnection to the lower input interconnection.

20 Claims, 8 Drawing Sheets

CHIP-ON-FILM PACKAGE HAVING BENDING PART

CROSS-REFERENCE TO RELATED APPLICATION

This application claims priority under 35 U.S.C. § 119 to Korean Patent Application No. 10-2014-0105205 filed on Aug. 13, 2014, the disclosure of which is hereby incorporated by reference in its entirety.

BACKGROUND

The subject matter disclosed herein relates to a chip-on-film package comprising a bending part.

Recently, as the trend for electronic products to become smaller, thinner and lighter weight, various chip-on-film (COF) packaging technologies using a flexible film substrate have been proposed as a high-density semiconductor chip packaging technology. Also, as the resolution of displays for mobile devices increase, the number of channels or signals that are needed to support an COF package is rapidly increasing. Design limitations and manufacturing costs are also increasing due to the decreasing sizes of via-lands. Accordingly, a COF package structure should be capable of minimizing the number of vias while responding to the trend for high-resolution displays.

SUMMARY

Embodiments provide a chip-on-film package which can reduce design limitations and manufacturing costs by reducing the number of vias.

Other embodiments provide a method of fabricating the chip-on-film package.

Other embodiments provide a display apparatus including the chip-on-film package.

In accordance with an embodiment, a chip-on-film package comprises a film substrate including an upper surface, a lower surface, and a side having a bending part; a semiconductor chip disposed on the upper surface of the film substrate in which the semiconductor chip comprises one or more output terminals and one or more input terminals; one or more first output interconnections formed on the upper surface of the film substrate and extending from the semiconductor chip toward the bending part and in which at least one of the first output interconnections is coupled to a corresponding output terminal of the semiconductor chip; one or more second output interconnections comprising at least one upper output interconnection and at least one lower output interconnection in which the at least one upper output interconnection is formed on the upper surface of the film substrate and the at least one lower output interconnection is formed on the lower surface of the film substrate and extends toward the bending part and in which at least one upper second output interconnection is coupled to a corresponding output terminal of the semiconductor chip and at least one lower second output interconnection is coupled to a corresponding output terminal of the semiconductor chip; one or more input interconnections comprising at least one upper input interconnection formed on the upper surface of the film substrate and at least one lower input interconnection in which the at least one lower input interconnection is formed on the lower surface of the film substrate and extends in a direction away from the bending part and at least one upper input interconnection is coupled to a corresponding input terminal of the semiconductor chip and at least one lower input interconnection is coupled to a corresponding input terminal of the semiconductor chip; and one or more through-vias formed to pass through the film substrate in which one or more first through-vias connect each upper second output interconnection to a corresponding lower second output interconnection, and one or more second through-vias connect each upper input interconnection to a corresponding lower input interconnection. In one embodiment, the output terminals of the semiconductor chip are coupled to a touch screen display.

In accordance with another embodiment, a chip-on-film package comprises a film substrate including an upper surface, a lower surface, and a side having a bending part; a semiconductor chip disposed on the film substrate; first interconnections formed on the upper surface of the film substrate and extending from the semiconductor chip toward the bending part, wherein portions of the first interconnections are disposed in the bending part; second interconnections including first upper interconnections formed on the upper surface of the film substrate and connected to the semiconductor chip, and first lower interconnections formed on the lower surface of the film substrate and extending onto the bending part; third interconnections including second upper interconnections formed on the upper surface of the film substrate and connected to the semiconductor chip, and second lower interconnections formed on the lower surface of the film substrate and extending in an opposite direction from the bending part; first through-vias formed to pass through the film substrate and electrically connect the first upper interconnections to the first lower interconnections; and second through-vias formed to pass through the film substrate and electrically connect the second upper interconnections to the second lower interconnections. In one embodiment, the first and second interconnections interconnect the semiconductor chip to a display device comprising a touch screen display.

In accordance with still another embodiment, a chip-on-film package includes a film substrate including an upper surface, a lower surface, and a side having a bending part, a semiconductor chip disposed on the upper surface of the film substrate, a first interconnection formed on the upper surface of the film substrate and extending toward the bending part; a second interconnection including a first upper interconnection and a first lower interconnection respectively formed on the upper surface and the lower surface of the film substrate, wherein the first lower interconnection extends onto the bending part; and a third interconnection including a second upper interconnection and a second lower interconnection respectively formed on the upper surface and the lower surface of the film substrate and extending in a direction away of the bending part. In one embodiment, the output terminals of the semiconductor chip are coupled to a touch screen display.

BRIEF DESCRIPTION OF THE DRAWINGS

The foregoing and other features and advantages of the subject matter disclosed herein will be apparent from the more particular description of preferred embodiments, as illustrated in the accompanying drawings in which like reference numerals denote the same respective parts throughout the different views. The drawings are not necessarily to scale, emphasis instead being placed upon illustrating the principles of the various embodiments.

In the drawings.

DETAILED DESCRIPTION OF THE EMBODIMENTS

Figure 1:
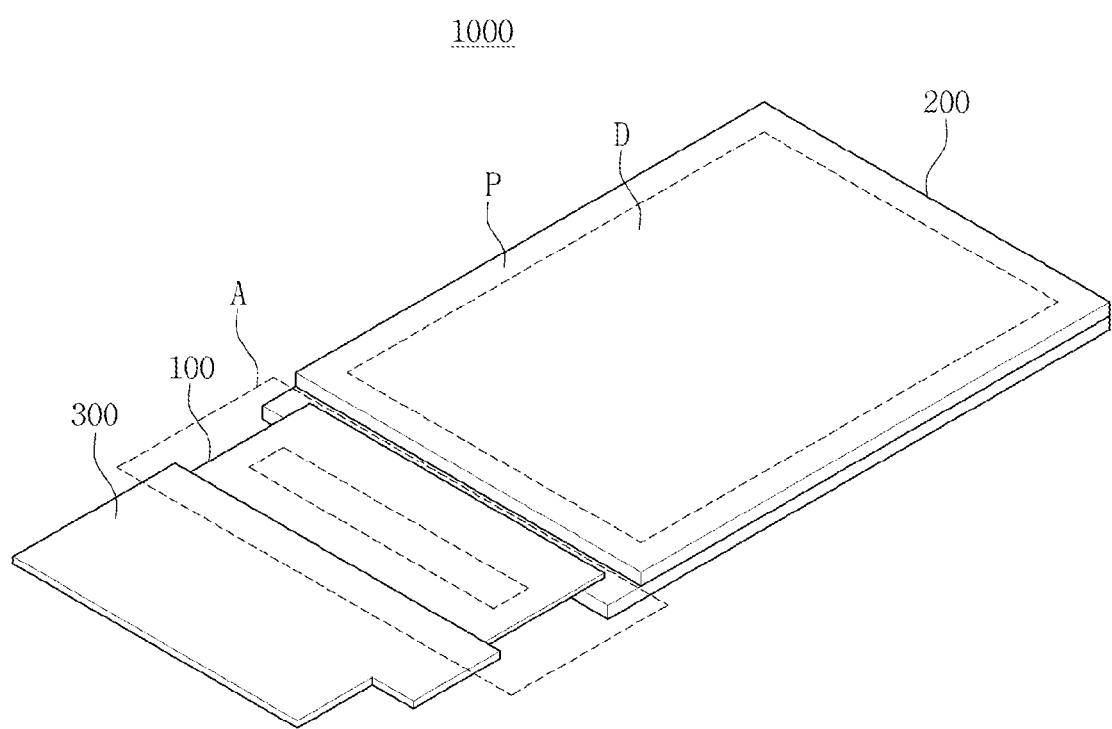
FIG. 1 is a perspective view conceptually showing a display apparatus including a chip-on-film package in accordance with an embodiment.

Various embodiments will now be described more fully with reference to the accompanying drawings in which some embodiments are shown. Embodiments may, however, be in different forms and should not be construed as limited to the various particular embodiments set forth herein. The embodiments herein are only provided for complete disclosure and to fully show the scope to those skilled in the art, which is only defined by the appended claims.

The terminology used herein to describe the embodiments is not intended to limit the scope of the claimed subject matter. The use of the singular form in the present document should not preclude the presence of more than one referent. In other words, elements referred to in the singular may number one or more, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "connected to" or "coupled to" another element or layer, it can be connected or coupled to the other element or layer or intervening elements or layers may be present. In contrast, when an element is referred to as "directly connected to" or "directly coupled to" another element or layer, there are no intervening elements or layers present. The term "and/or" includes any and all combinations of one or more referents.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation.

Embodiments are described herein with reference to a cross-sectional view, a plan view, and/or a block diagram that are schematic illustrations of idealized embodiments and intermediate structures. As such, variations from the shapes of the illustrations as a result, for example, of manufacturing techniques and/or tolerances, are to be expected. Thus, embodiments should not be construed as limited to the particular shapes of regions illustrated herein, but are to include deviations in shapes that result, for example, from manufacturing. For example, an etched region illustrated as a rectangle will, typically, have rounded or features having a predetermined curvature. Thus, the regions illustrated in the figures are schematic in nature and their shapes are not intended to illustrate the actual shape of a region of a device and are not intended to limit the scope of the claimed subject matter.

The same reference numerals denote the same elements throughout the specification. Accordingly, the same numerals and similar numerals can be described with reference to other drawings, even if not specifically described in a corresponding drawing. Further, when an item is not marked in a drawing, the item can be described with reference to other drawings.

Terms such as "upper surface" and "lower surface" may be used in a relative sense herein to facilitate easy understanding. Accordingly, "upper surface" and " lower surface" may not refer to any specific direction, location, or component, and may be used interchangeably. For example, "upper surface" may be interpreted as "lower surface" and vice versa. Also, "upper surface" may be expressed as "first side," and "lower surface" may be expressed as "second side," and vice versa. However, "upper surface" and "lower surface" cannot be used interchangeably in the same embodiment.

FIG. 1 is a perspective view conceptually showing a display apparatus including a chip-on-film (COF) package in accordance with an embodiment of the inventive concept.

Referring to FIG. 1, a display apparatus 1000 may comprise a display panel 200, a printed circuit board (PCB) 300, and a chip-on-film (COF) package 100.

The display panel 200 may comprise a liquid crystal display panel or an organic light-emitting display panel. The display panel 200 may comprise a display region D displaying an image, and a peripheral region P applying a driving signal to the display region D. Although not specifically shown in FIG. 1, the display panel 200 may include an upper panel, a lower panel, an organic light-emitting structure or a liquid crystal structure, a plurality of gate lines, and a plurality of data lines, which are formed between the upper panel and the lower panel. Each of the upper panel and the lower panel may comprise a glass substrate, a quartz substrate, a transparent plastic substrate, or the like. For example, in this embodiment, the display panel 200 may comprise a transparent plastic substrate. The display panel 200 comprising such a transparent plastic substrate may be a flexible substrate.

The PCB 300 may comprise, for example, a flexible PCB (FPCB). The PCB 300 may receive various signals from external to PCB 300 and output the signals to the COF package 100.

The COF package 100 may process the various signals input from the PCB 300 and output a driving signal for driving the display panel 200. For this, a first side of the COF package 100 may be attached to the display panel 200, and a second side of the COF package 100 may be attached to the PCB 300. For example, an upper surface and a lower surface of the COF package 100 may respectively be attached to the display panel 200 and the PCB 300. The COF package 100 in accordance with the embodiment may include a bending or curved part B (refer to FIGS. 4A and 4B) in the first side attached to the display panel 200. Hereinafter, the COF package 100 in accordance with the embodiment will be described in detail.

Figure 2A:
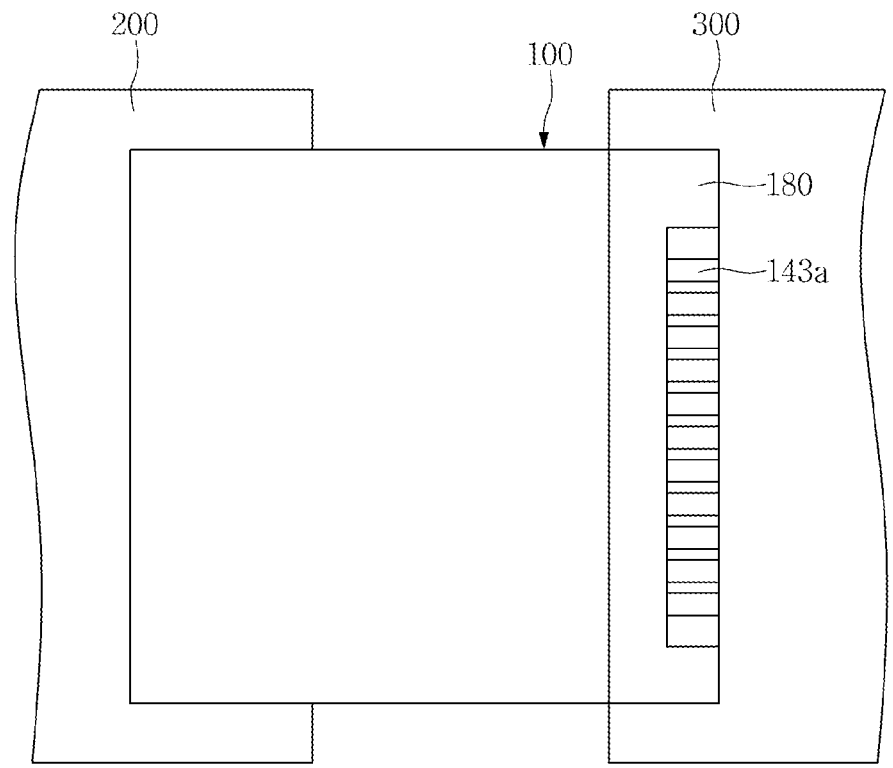
FIG. 2A is a top view of the part A in FIG. 1.
Figure 2B:
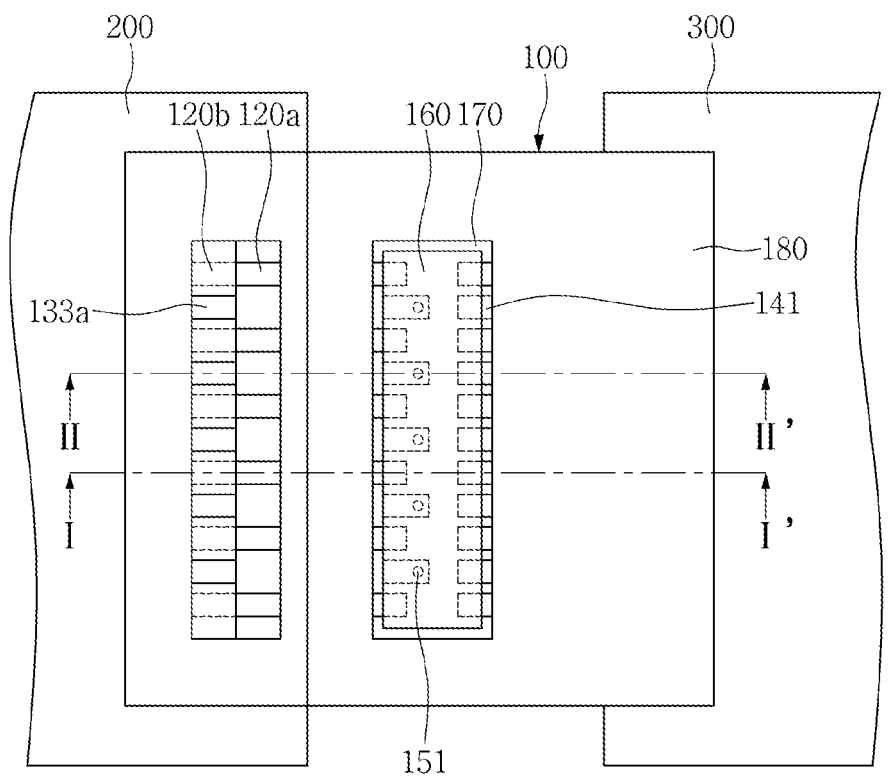
FIG. 2B is a bottom view of the part A in FIG. 1.
Figure 3A:
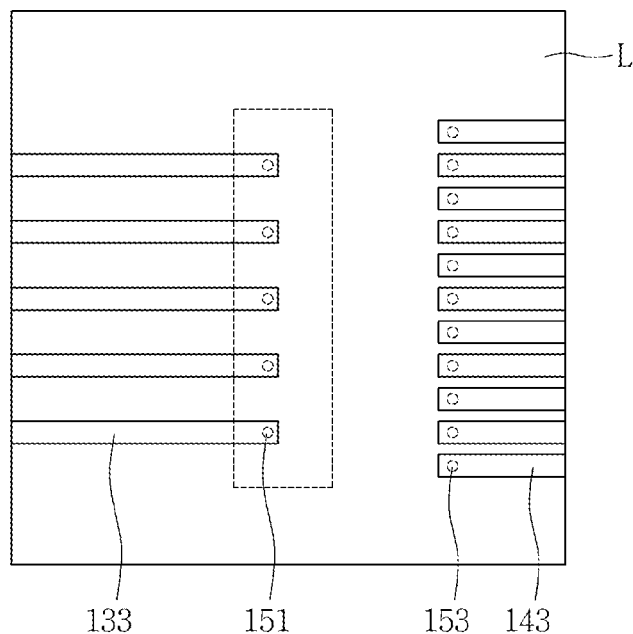
FIGS. 3A and 3B are a top view and a bottom view conceptually showing states in which protection layers illustrated in FIGS. 2A and 2B are omitted, respectively.
Figure 3B:
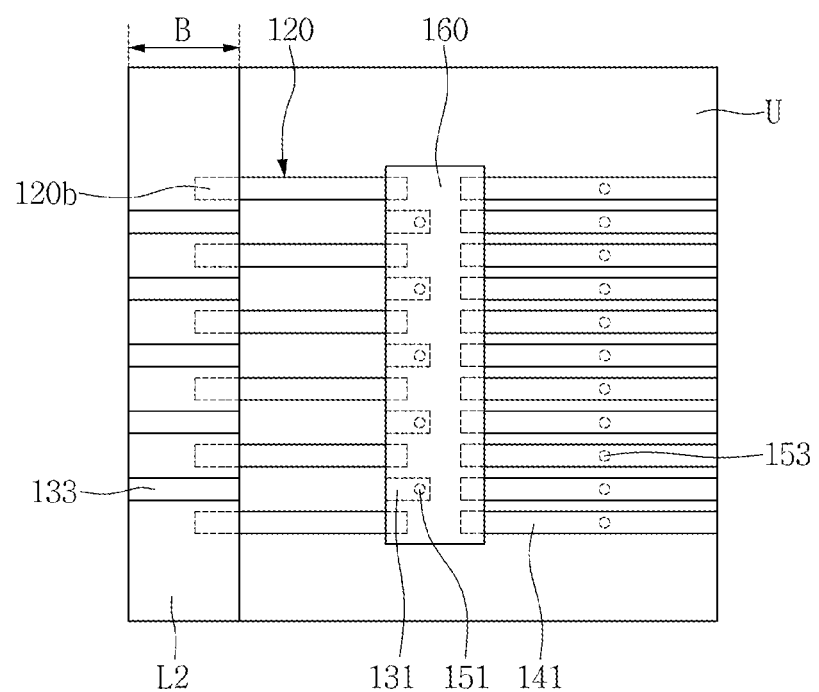
Figure 4A:
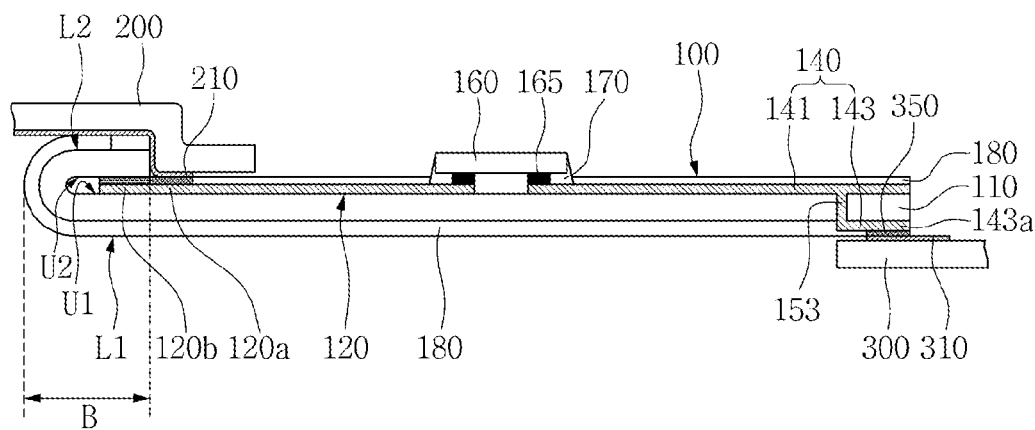
FIGS. 4A and 4B are cross-sectional views taken along lines I-I' and II-IF in FIG. 2B, respectively, conceptually showing a chip-on-film package.
Figure 4B:
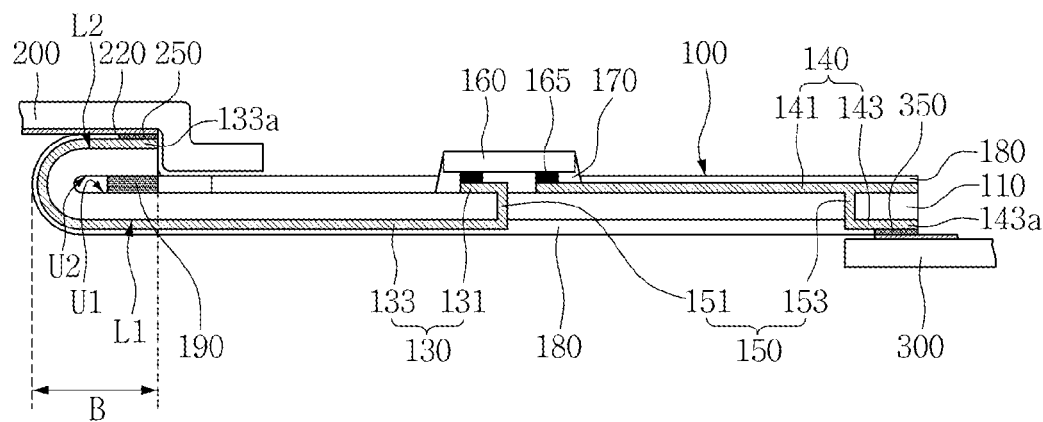

FIG. 2A is a top view of the part A in FIG. 1, and FIG. 2B is a bottom view of the part A in FIG. 1. FIGS. 3A and 3B are a top view and a bottom view conceptually showing states in which a protection layer and an underfill portion illustrated in FIGS. 2A and 2B are omitted, respectively. FIGS. 4A and 4B are cross-sectional views taken along lines I-I' and II-IF in FIG. 2B, respectively, conceptually showing a COF package.

Referring to FIGS. 2A to 4B, a COF package 100 in accordance with an embodiment may include a film substrate 110, one or more first output interconnections 120, one or more second output interconnections 130, one or more input interconnections 140, through-vias 150, and a semiconductor chip 160. Although only one semiconductor chip 160 is shown in the Figures, it should be understood that one or more semiconductor chips 160 could be part of COF package 100. In addition, the COF package 100 may further include an underfill portion 170, one or more protection layers 180, and an adhesive layer 190.

The film substrate 110 may include, for example, a resin film comprising polyimide or polyester. The film substrate 110 may have flexibility. The film substrate 110 may include an upper surface U and a lower surface L. A bending part B may be formed at a side portion of the film substrate 110. For example, the bending part B may be formed by bending the side portion of the film substrate 110 toward the upper surface U. Accordingly, the bending part B may include the lower surface L facing up and down on the outside of the bend, and the upper surface U facing itself on the inside of the bend. Here, the lower surface L may include a first lower surface L1 facing down and a second lower surface L2 facing up. In addition, the upper surface U facing itself may include a first upper surface U1 facing up and a second upper surface U2 facing down. Here, the first upper surface U1 and the second upper surface U2 may be spaced apart.

The first output interconnections 120 may be formed on the upper surface U of the film substrate 110. The first output interconnections 120 may include a conductive metal, such as copper (Cu), nickel (Ni), or aluminum (Al). Each of the first output interconnections 120 may include a first output terminal 120a and a first test terminal 120b. In this case, the first output terminal 120a may be adjacent to the first test terminal 120b.

The first output interconnections 120 may extend from the semiconductor chip 160 toward the bending or curved part B. More specifically, one side of the first output interconnections 120 may be disposed under the semiconductor chip 160, and the other side of the first output interconnections 120 may extend toward the bending part B to be disposed in the bending part B. For example, the first test terminal 120b of the first output interconnections 120 may be disposed in the bending part B. That is, the first test terminal 120b of the first output interconnections 120 may be disposed between the first upper surface U1 and the second upper surface U2 of the bending part B.

The first output interconnections 120 may be used for operating, or controlling, the display 200. For example, the first output interconnections 120 may output a signal through the first output terminal 120a to display panel 200 in which the signal has been processed in the semiconductor chip 160.

The second output interconnections 130 may be formed on the upper surface U and the lower surface L of the film substrate 110. The second output interconnections 130 may include a conductive metal, such as Cu, Ni, or Al. Each of the second output interconnections 130 may include an upper output interconnection 131 and a lower output interconnection 133. In addition, the lower output interconnection 133 may include a second output terminal 133a.

The upper output interconnection 131 may be formed on the upper surface U of the film substrate 110, and extend from the semiconductor chip 160 away from the bending part B. That is, the upper output interconnection 131 may extend in a direction away from the bending part B on the upper surface U of the film substrate 110. Here, the upper output interconnection 131 may be disposed only under the semiconductor chip 160. That is, as shown in FIG. 3B, a horizontal width of the upper output interconnection 131 may be smaller than a horizontal width of the semiconductor chip 160 as seen in a top view.

The lower output interconnection 133 may be formed on the lower surface L of the film substrate 110, and extend from the semiconductor chip 160 toward the side portion of the film substrate 110, toward the bending part B. For example, the lower output interconnection 133 may extend onto the bending part B. That is, the lower output interconnection 133 may be formed to the second lower surface L2 of the bending part B. In this way, the lower output interconnection 133 formed on the second lower surface L of the bending part B may be disposed above the film substrate 110.

The second output terminal 133a may be disposed on the second lower surface L2 of the bending part B. For example, the second output terminal 133a may be an end portion of the lower output interconnection 133. Accordingly, the second output terminal 133a may be exposed in the same direction as the first output terminal 120a being exposed. That is, each of the first output terminal 120a and the second output terminal 133a may be disposed on the film substrate 110 and be oriented in the same direction. Here, a surface of the first output terminal 120a may be disposed at a different level from a surface of the second output terminal 133a. For example, referring to FIGS. 4A and 4B, a distance from a surface of the film substrate 110 to the surface of the first output terminal 120a may be shorter than a distance from the surface of the film substrate 110 to the surface of the second output terminal 133a. That is, the surface of the first output terminal 120a may be disposed at a lower level than the surface of the second output terminal 133a.

In this way, because the first output terminal 120a and the second output terminal 133a are disposed at different levels, the display panel 200 attached to the first output terminal 120a and the second output terminal 133a of the COF package 100 may not be bent as shown in FIGS. 4A and 4B. For example, the first output terminal 120a and the second output terminal 133a may respectively be joined to a first connection terminal 210 and a second connection terminal 220 of the display panel 200. Here, an adhesive film 250 may be interposed between the first output terminal 120a and the first connection terminal 210 and between the second output terminal 133a and the second connection terminal 220. Here, the adhesive film 250 may comprise an anisotropic conducting film (ACF).

In addition, the upper output interconnection 131 and the lower output interconnection 133 may be formed on locations corresponding to the upper surface U and the lower surface L of the film substrate 110, respectively. The upper output interconnection 131 may be electrically connected to the lower output interconnection 133 through a through-vias 150. The second output interconnections 130 including the upper output interconnection 131 and the lower output interconnection 133 may be used for operating, or controlling, the display 200. For example, the second output interconnections 130 may output a signal processed in the semiconductor chip 160 to the display panel 200 through the second output terminal 133a.

Meanwhile, referring to FIG. 3B, the first output interconnections 120 and the second output interconnections 130 may be alternately and repeatedly disposed in a top view. In addition, the first output terminals 120a and the second output terminals 133a may be disposed in a zigzag manner with respect to each other.

The input interconnections 140 may be formed on the upper surface U and the lower surface L of the film substrate 110. The input interconnections 140 may include a conductive material, such as Cu, Ni, or Al. The input interconnections 140 may include an upper input interconnection 141 and a lower input interconnection 143. The lower input interconnection 143 may include input terminals 143a.

The upper input interconnection 141 may be formed on the upper surface U of the film substrate 110 and extend from the semiconductor chip 160 toward the other side portion of the film substrate 110 away from the bending part B. That is, the upper input interconnection 141 may extend in a direction of away from the bending part B. The lower input interconnection 143 may be formed on the lower surface L of the film substrate 110.

The upper input interconnection 141 may be electrically connected to the lower input interconnection 143 through the through-vias 150. The input interconnections 140 including the upper input interconnection 141 and the lower input interconnection 143 may be used for operating, or controlling, the semiconductor chip 160. For example, the input interconnections 140 may receive a signal supplied from the PCB 300 to the semiconductor chip 160 through the input terminals 143a. More specifically, the input terminals 143a may be connected to third connection terminals 310 of the PCB 300, as shown in FIGS. 4A and 4B. Here, adhesive films 350 may be interposed between the input terminals 143a and the third connection terminals 310. The adhesive film 350 may comprise an ACF.

The through-vias 150 may be formed to pass through the film substrate 110. The through-vias 150 may include a conductive film, such as Cu, Ni, or Al. The through-vias 150 may include first through-vias 151 disposed near semiconductor chip 160 and second through-vias 153 disposed near PCB 300.

The first through-vias 151 may electrically connect the upper output interconnections 131 of the second output interconnections 130 respectively to lower output interconnections 133 of the second output interconnections 130. The second through-vias 153 may electrically connect the upper input interconnections 141 of the input interconnections 140 to the lower input interconnections 143 of the input interconnections 140.

The semiconductor chip 160 may be disposed on the upper surface U of the film substrate 110. Output terminals (not shown) of the semiconductor chip 160 may be electrically connected to the first output interconnections 120, and the second output interconnections 130, and input terminals (not shown) of the semiconductor chip 160 may be electrically connected to the input interconnections 140. For this, bumps 165 may be formed under the semiconductor chip 160. That is, the semiconductor chip 160 may be electrically connected to the first output interconnections 120, the second output interconnections 130, and the input interconnections 140 through the bumps 165. Here, the bumps 165 may be formed from, for example, gold (Au), but is not limited thereto.

The underfill portion 170 may be formed to cover side surfaces of the semiconductor chip 160 on the film substrate 110 and fill between a lower surface of the semiconductor chip 160 and the upper surface U of the film substrate 110. The underfill portion 170 may comprise a resin. The semiconductor chip 160 may be fixed on the upper surface U of the film substrate 110 by the underfill portion 170. In addition, portions that connect the bumps 165 of the semiconductor chip 160 to the first output interconnections 120, the second output interconnections 130, and the input interconnections 140 may be protected by the underfill portion 170.

The one or more protection layers 180 may be formed on the upper surface U and the lower surface L of the film substrate 110. The protection layers 180 may comprise a solder resist, but is not limited thereto. For example, referring to FIG. 2B, a protection layer 180 may be configured to expose the plurality of the first output terminals 120a, the plurality of second output terminals 133a, and the semiconductor chip 160 on the upper surface U of the film substrate 110. In addition, referring to FIG. 2A, a protection layer 180 may also be configured to expose the plurality of input terminals 143a on the lower surface L of the film substrate 110. In addition, referring to FIGS. 4A and 4B, the protection layer 180 formed on the lower surface L of the film substrate 110 may extend onto the second lower surface L2 via the first lower surface L1 of the bending part B.

The adhesive layer 190 may be formed between the first upper surface U1 and the second upper surface U2 of the bending part B, and between the first test terminals 120b of the first output interconnections 120 and the second upper surface U2 of the bending part B. Accordingly, the adhesive layer 190 may fix a bending state of the bending part B. The adhesive layer 190 may comprise a nonconductive adhesive material.

The COF package in accordance with an embodiment has been described above. In the COF package 100, the number of through-vias that connect lower interconnections of the film substrate 110 to upper interconnections of the film substrate 110 may be reduced by forming a bending part at a side portion of the film substrate 110 so that the lower interconnections are disposed above the film substrate 110. In addition, by reducing the number of through-vias passing through the film substrate, design freedom may be obtained and, at the same time, manufacturing costs may be reduced.

Figure 5A:
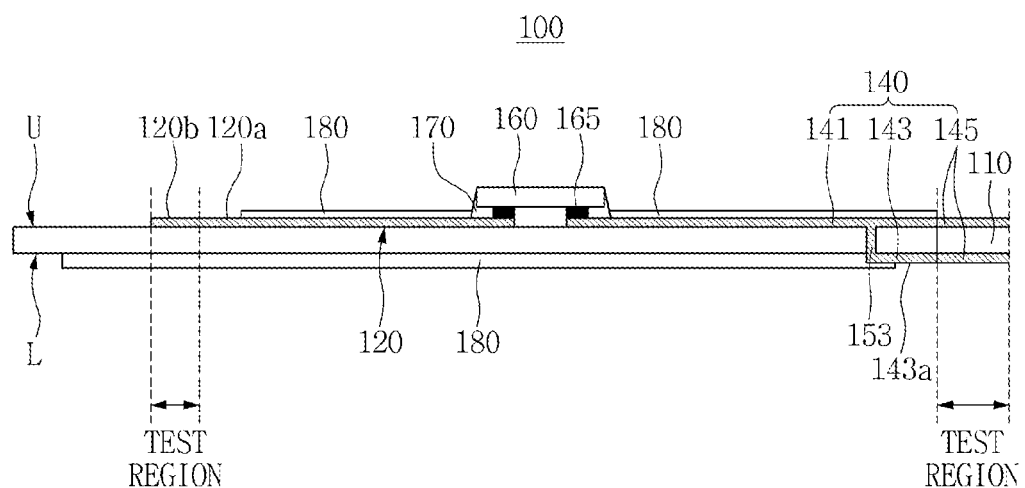
FIGS. 5A and 5B are cross-sectional views taken along lines I-I' and II-IF in FIG. 2B, respectively, conceptually showing the COF package during a first stage of fabrication.
Figure 5B:
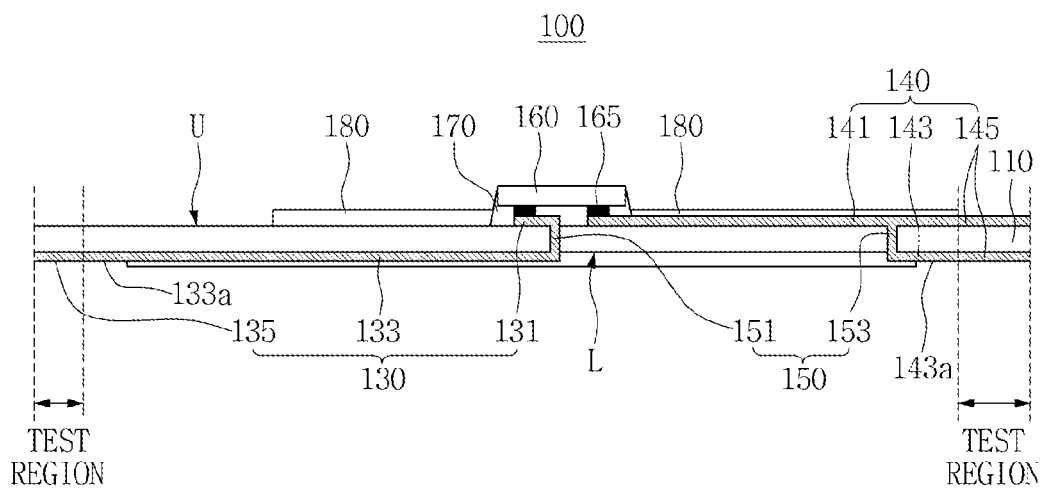
Figure 6A:
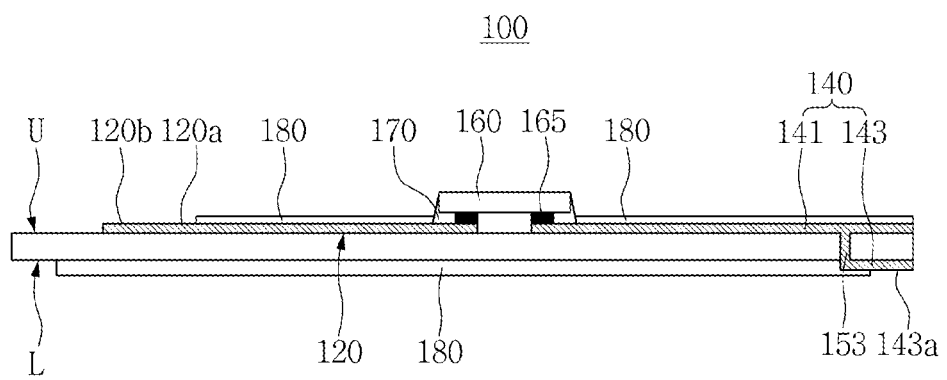
FIGS. 6A and 6B are cross-sectional views taken along lines I-I' and II-IF in FIG. 2B, respectively, conceptually showing the COF package during a second stage of fabrication.
Figure 6B:
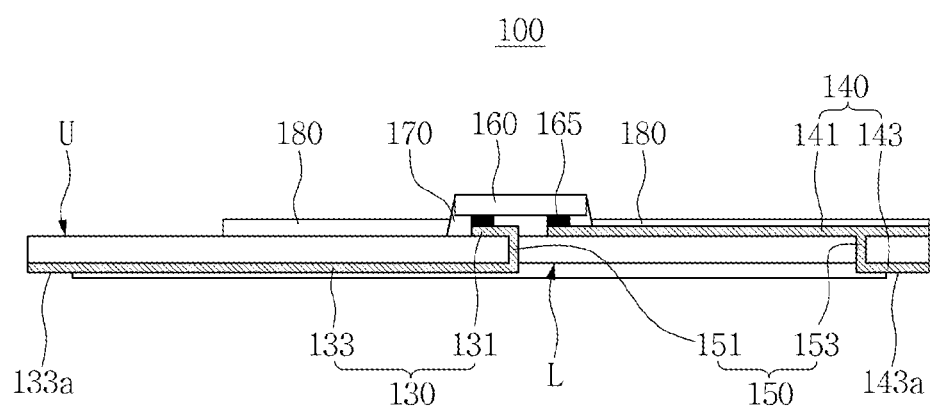
Figure 7A:
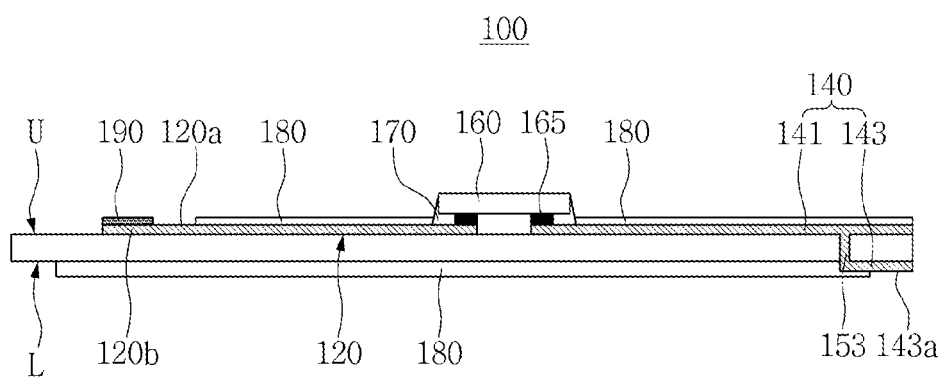
FIGS. 7A and 7B are cross-sectional views taken along lines I-I' and II-IF in FIG. 2B, respectively, conceptually showing the COF package during a third stage of fabrication.
Figure 7B:
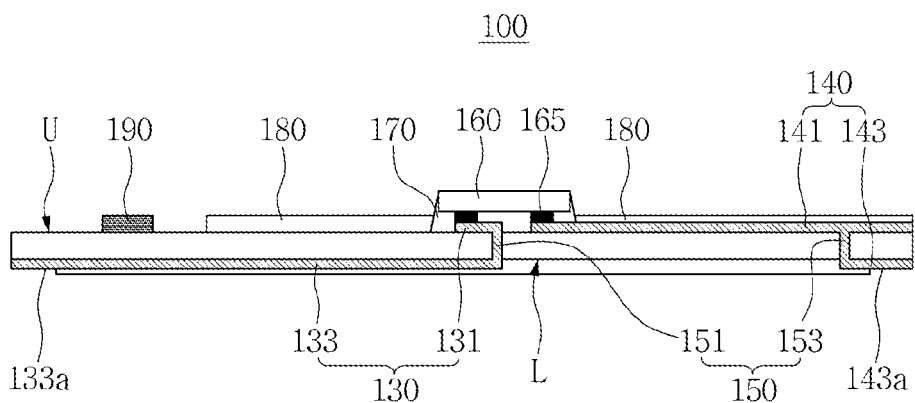

FIGS. 5A to 7B are diagrams for describing a method of fabricating a COF package in accordance with an embodiment. FIGS. 5A and 5B are cross-sectional views taken along lines I-I' and II-II' in FIG. 2B, respectively, conceptually showing the COF package during a first stage of fabrication. FIGS. 6A and 6B are cross-sectional views taken along lines I-I' and II-IF in FIG. 2B, respectively, conceptually showing the COF package during a second stage of fabrication. FIGS. 7A and 7B are cross-sectional views taken along lines I-I' and II-IF in FIG. 2B, respectively, conceptually showing the COF package during a third stage of fabrication.

Referring to FIGS. 5A and 5B, the method of fabricating a COF package in accordance with an embodiment may include forming first output interconnections 120, second output interconnections 130, and input interconnections 140 on an upper surface U and a lower surface L of a film substrate 110; forming a protection layer 180 exposing portions of the first output interconnections 120, portions of the second output interconnections 130, and portions of the input interconnections 140; and attaching a semiconductor chip 160 to the upper surface U of the film substrate 110. In addition, the method may further include forming an underfill portion 170 covering side surfaces of the semiconductor chip 160 on the upper surface U of the film substrate 110 and filling between a lower surface of the semiconductor chip 160 and the upper surface U of the film substrate 110.

The formation of the first output interconnections 120, the second output interconnections 130, and the input interconnections 140 may include forming a metal layer on the upper surface U and lower surface L of the film substrate 110 using an electroplating method, or the like.

The first output interconnections 120 may include first test terminals 120b formed on a test region of the upper surface U of the film substrate 110.

The second output interconnections 130 may include upper output interconnections 131 formed on the upper surface U of the film substrate 110, and lower output interconnections 133 formed on the lower surface L of the film substrate 110. In addition, the lower output interconnections 133 may include second test terminals 135 formed on the test region.

The input interconnections 140 may include an upper input interconnections 141 formed on the upper surface U of the film substrate 110, and lower input interconnections 143 formed on the lower surface L of the film substrate 110. In addition, the lower input interconnections 143 may include third test terminals 145 formed on the test region.

Meanwhile, the formation of the first output interconnections 120, the second output interconnections 130, and the input interconnections 140 may include forming through-vias 150 passing through the film substrate 110. The formation of the through-vias 150 may include forming through-via-holes (not shown) passing through the film substrate 110 and forming metal vias filling the through-via-hole using an electroplating method, sputtering, or the like.

Each of the first output interconnections 120, the second output interconnections 130, the input interconnections 140, and the through-vias 150 may comprise a conductive material, such as Cu, Ni, or Al.

The protection layer 180 may be formed to expose portions of the first output interconnections 120, portions of the second output interconnections 130, and portions of the input interconnections 140 on the upper surface U and lower surface L of the film substrate 110. More specifically, the protection layer 180 may be formed to expose the first test terminal 120b and first output terminal 120a of the first output interconnections 120, the second test terminals 135 and second output terminal 133a of the second output interconnections 130, and the third test terminal 145 and input terminals 143a of the input interconnections 140. The protection layer 180 may be formed by performing a screen printing process. The protection layer 180 may comprise a solder resist.

The attachment of the semiconductor chip 160 to the upper surface U of the film substrate 110 may include disposing the semiconductor chip 160 on the film substrate 110 such that a plurality of bumps 165 disposed under the semiconductor chip 160 are aligned on the first output interconnections 120, the upper output interconnections 131, and the upper input interconnections 141, and flip-chip bonding the semiconductor chip 160 to the first output interconnections 120, the upper output interconnections 131, and the upper input interconnections 141 using a heat-pressing tape automated bonding (TAB) process.

The formation of the underfill portion 170 on the upper surface U of the film substrate 110 may include coating an underfill material covering side surfaces of the semiconductor chip 160 and filling between a lower surface of the semiconductor chip 160 and the upper surface U of the film substrate 110, and curing the coated underfill material by heating. The underfill material may comprise a resin.

Referring to FIGS. 6A and 6B, the method of fabricating a COF package in accordance with an embodiment may further include removing the test region disposed at both ending sides of the film substrate 110 in a cutting process. Accordingly, the second test terminals 135 of the second output interconnections 130 and the third test terminals 145 of the input inter-connections 140 may be removed. At this time, the first test terminals 120b disposed on the upper surface U of the film substrate 110 may remain.

Referring to FIGS. 7A and 7B, the method of fabricating a COF package in accordance with an embodiment may further include forming an adhesive layer 190 on the upper surface U of the film substrate 110 between the first test terminals 120b and the first test terminals 120b. The adhesive layer 190 may comprise a non-conductive adhesive film or a non-conductive adhesive paste.

Referring to FIGS. 4A and 4B, the method of fabricating a COF package in accordance with an embodiment may include upwardly bending a side portion of the film substrate 110 and forming a bending part B at the side portion of the film substrate 110 by bonding the second upper surface U2 of the film substrate 110 to the first test terminals 120b, and the second upper surface U2 to the first upper surface U1 disposed between the first test terminals 120b.

Figure 8:
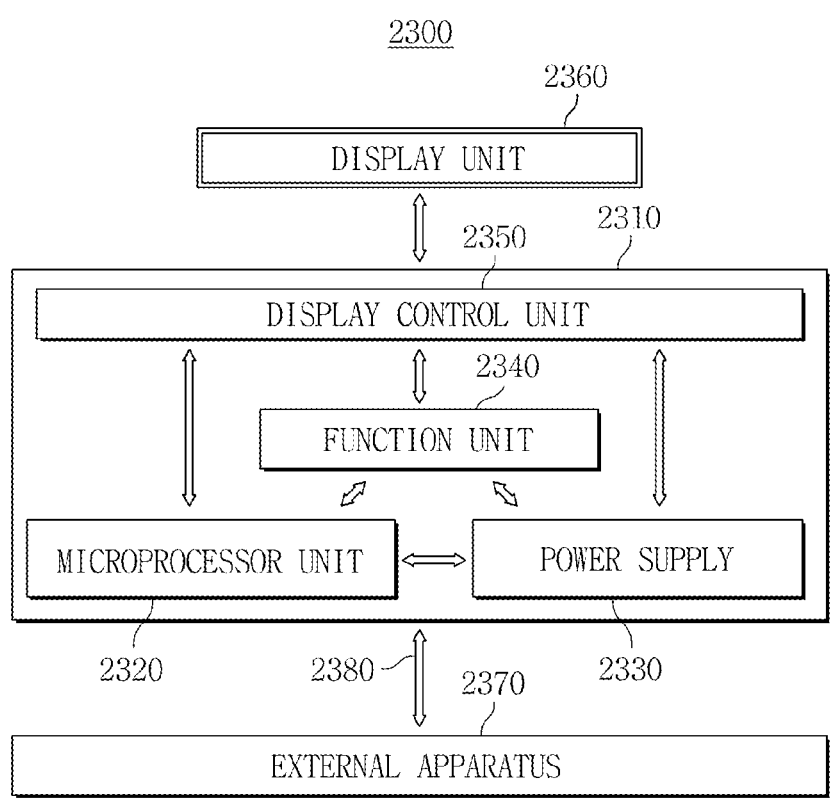
FIG. 8 is a block diagram conceptually illustrating an electronic system 2300 in accordance with an embodiment.

FIG. 8 is a block diagram conceptually illustrating an electronic system 2300 in accordance with an embodiment. Referring to FIG. 8, the electronic system 2300 in accordance with an embodiment may include a body 2310, a display unit 2360, and an external apparatus 2370. The body 2310 may include a microprocessor unit 2320, a power supply 2330, a function unit 2340, and/or a display control unit 2350.

The body 2310 may include a system board or motherboard having a PCB, and/or a case.

The microprocessor unit 2320, the power supply 2330, the function unit 2340, and the display control unit 2350 may be installed or arranged on an upper surface or an inside of the body 2310. The display control unit 2350 may include a COF package 100 in accordance with various embodiments.

A display unit 2360 may be arranged on an upper surface or inside/outside of the body 2310. The display unit 2360 may display an image processed by the display control unit 2350. For example, the display unit 2360 may include a liquid crystal display (LCD), an active matrix organic light emitting diode (AMOLED) display, or a variety of display panels. The display unit 2360 may comprise a touch-screen.

The power supply 2330 may supply a current or voltage to the microprocessor unit 2320, the function unit 2340, and the display control unit 2350, etc. The power supply 2330 may include a rechargeable battery, a socket for a dry cell, or a voltage/current converter.

The microprocessor unit 2320 may receive a voltage from the power supply 2330 to control the function unit 2340 and the display unit 2360. For example, the microprocessor unit 2320 may include a CPU or an application processor (AP).

The function unit 2340 may include a touch-pad, a touch-screen, a volatile/nonvolatile memory, a memory card controller, a camera, a lighting, an audio and video playback processor, a wireless transmission/reception antenna, a speaker, a microphone, a Universal Serial Bus (USB) port, and other units having various functions.

In the COF package in accordance with an embodiment, since a bending portion, by which a lower interconnection is disposed above a film substrate, is formed at a side portion of the film substrate, there is no need to form additional through-vias which connect the lower interconnection to an upper interconnection. Accordingly, the number of through-vias may be reduced.

In addition, by reducing the number of through-vias passing through the film substrate, the degree of freedom in interconnection design can be obtained and, at the same time, manufacturing costs can be reduced.

The foregoing is illustrative of embodiments and is not to be construed as limiting thereof. Although a few embodiments have been described, those skilled in the art will readily appreciate that many modifications are possible without materially departing from the teachings and advantages. Accordingly, all such modifications are intended to be included within the scope as defined in the claims.

What is claimed is:

1. A chip-on-film package, comprising:
a film substrate comprising an upper surface, a lower surface, and a side having a bending part;
a semiconductor chip disposed on the upper surface of the film substrate, the semiconductor chip comprising one or more output terminals and one or more input terminals;
one or more first output interconnections formed on the upper surface of the film substrate and extending from the semiconductor chip toward the bending part of the film substrate, at least one of the first output interconnections being coupled to a corresponding output terminal of the semiconductor chip;
one or more second output interconnections comprising at least one upper second output interconnection and at least one lower second output interconnection, the at least one upper second output interconnection being formed on the upper surface of the film substrate, and the at least one lower second output interconnection being formed on the lower surface of the film substrate and extending toward the bending part of the film substrate, at least one upper second output interconnection being coupled to a corresponding output terminal of the semiconductor chip and at least one lower second output interconnection being coupled to a corresponding output terminal of the semiconductor chip;
one or more input interconnections comprising at least one upper input interconnection and at least one lower input interconnection, the at least one upper input interconnection being formed on the upper surface of the film substrate, and the at least one lower input interconnection being formed on the lower surface of the film substrate and extending in a direction away from the bending part of the film substrate, at least one upper input interconnection being coupled to a corresponding input terminal of the semiconductor chip and at least one lower input interconnection being coupled to a corresponding input terminal of the semiconductor chip; and
one or more through-vias formed to pass through the film substrate, one or more first through-vias electrically connecting each upper second output interconnection to a corresponding lower second output interconnection of the one or more second output interconnections, and one or more second through-vias electrically connecting each upper input interconnection to a corresponding lower input interconnection of the one or more input interconnections.

2. The chip-on-film package of claim 1, wherein a portion of the at least one lower second output interconnection extending toward the bending part of the film substrate is disposed above the film substrate.

3. The chip-on-film package of claim 2, wherein a surface of the at least one lower second output interconnection disposed above the film substrate is located within the bending part of the film substrate at a different level from a surface of the at least one first output interconnection.

4. The chip-on-film package of claim 3, wherein the surface of the at least one lower second output interconnection disposed above the film substrate is located within the bending part of the film substrate at a higher level than the surface of the at least one first output interconnection.

5. The chip-on-film package of claim 1, further comprising one or more protection layers, the one or more protection layers configured to expose a portion of the first output interconnection, a portion of the lower second output interconnection, and a portion of the lower input interconnection on the upper surface and the lower surface of the film substrate.

6. The chip-on-film package of claim 5, wherein the one or more protection film layers formed on the lower surface of the film substrate extend onto the bending part.

7. The chip-on-film package of claim 1, wherein the bending part comprises a portion of the film substrate that is bent:
a first lower surface of the film substrate that is bent facing down from the film substrate and a second lower surface of the film substrate that is bent facing up from the film substrate; and
a first upper surface of the film substrate that is bent facing up from the film substrate and a second upper surface of the film substrate that is bent facing down from the film substrate toward the first upper surface of the film substrate and being adjacent to each other.

8. The chip-on-film package of claim 7, wherein a portion of the first output interconnection is disposed between the first upper surface and the second upper surface of the bending part of the film substrate.

9. The chip-on-film package of claim 8, further comprising an adhesive layer formed between the first upper surface and the second upper surface of the bending part of the film substrate, and between the portion of the first output interconnection and the second upper surface.

10. The chip-on-film package of claim 1, wherein the output terminals of the semiconductor chip are coupled to a touch screen display.

11. A chip-on-film package, comprising:
a film substrate comprising an upper surface, a lower surface, and a side having a bending part;
one or more semiconductor chips disposed on the film substrate, at least one semiconductor chip comprising one or more output terminals and one or more input terminals;
one or more first interconnections formed on the upper surface of the film substrate and extending from the at least one semiconductor chip toward the bending part, a portion of the at least one first interconnection being disposed in the bending part;
one or more second interconnections comprising at least one first upper interconnection formed on the upper surface of the film substrate and at least one first lower interconnection formed on the lower surface of the film substrate and extending into the bending part, the at least one first upper interconnection being connected to a corresponding terminal of the at least one semiconductor chip and the at least one first lower interconnection being connected to a corresponding terminal of the at least one semiconductor chip;
one or more third interconnections comprising at least one second upper interconnection formed on the upper surface of the film substrate and at least one second lower interconnection formed on the lower surface of the film substrate and extending in a direction away from the bending part of the film substrate, the at least one second upper interconnection being connected to a corresponding terminal of the at least one semiconductor chip, and the at least one second lower interconnection being connected to a corresponding terminal of the at least one semiconductor chip;

one or more first through-vias formed to pass through the film substrate and electrically connect the at least one first upper interconnection to a corresponding first lower interconnection; and one or more second through-vias formed to pass through the film substrate and electrically connect the at least one second upper interconnection to a corresponding second lower interconnection.

12. The chip-on-film package of claim 11, wherein first interconnections and second interconnections comprise output interconnections to output a corresponding signal processed in the semiconductor chip.

13. The chip-on-film package of claim 11, wherein the third interconnections comprise input interconnections to receive a corresponding signal supplied to the at least one semiconductor chip.

14. The chip-on-film package of claim 11, wherein the first interconnections and the second interconnections are arranged in a zigzag manner with respect to each other.

15. The chip-on-film package of claim 11, wherein the second lower interconnections extending onto the bending part are disposed above the film substrate, and surfaces of the second interconnections disposed above the film substrate are located at a higher level than surfaces of the first interconnections.

16. The chip-on-film package of claim 11, wherein the output terminals of the at least one semiconductor chip are coupled to a touch screen display.

17. A display apparatus, comprising:
a display panel; and
a chip-on-film (COF) device, the COF device comprising:
   a film substrate comprising an upper surface, a lower surface, and a side having a bending part;
   one or more semiconductor chips disposed on the upper surface of the film substrate, at least one semiconductor chip comprising one or more output terminals and one or more input terminals;
   a plurality of first output interconnections formed on the upper surface of the film substrate and extending from the at least one semiconductor chip toward the bending part of the film substrate, the first output interconnections being coupled to a corresponding output terminal of the at least one semiconductor chip;
   a plurality of second output interconnections comprising a plurality of upper second output interconnections and a plurality of lower second output interconnections, the upper second output interconnections being formed on the upper surface of the film substrate, and the lower second output interconnections being formed on the lower surface of the film substrate and extending toward the bending part of the film substrate, the upper second output interconnections being coupled to corresponding output terminals of the at least one semiconductor chip and the lower second output interconnections being coupled to corresponding output terminals of the at least one semiconductor chip;
   a plurality of input interconnections comprising a plurality of upper input interconnections and a plurality of lower input interconnections, the upper input interconnections being formed on the upper surface of the film substrate, and the lower input interconnections being formed on the lower surface of the film substrate and extending in a direction away from the bending part of the film substrate, the upper input interconnections being coupled to corresponding input terminals of the at least one semiconductor chip and the lower input interconnections being coupled to corresponding input terminals of the at least one semiconductor chip; and
   a plurality of through-vias formed to pass through the film substrate, one or more first through-vias electrically connecting each upper second output interconnection to a corresponding lower second output interconnection, and one or more second through-vias electrically connecting each upper input interconnection to a corresponding lower input interconnection.

18. The display apparatus of claim 17, wherein the display panel comprises a first panel portion, a bent panel portion and a third panel portion, the bent panel portion being disposed between the first panel portion and the second panel portion, the first panel portion comprising a first plurality of terminals and the second panel portion comprising a second plurality of terminals,
   wherein the first output interconnections connect are coupled to corresponding terminals of the second plurality of terminals, and the second output interconnections are coupled to corresponding terminals of the first plurality of terminals, and
   wherein the lower surface of the film substrate is coupled to the first panel portion.

19. The display apparatus of claim 18, wherein terminals of the first plurality of terminals and terminals of the second plurality of terminals are disposed in a zigzag manner with respect to each other.

20. The display apparatus of claim 17, wherein the display panel is a touch screen display.

* * * * *